(12) United States Patent
Chandra et al.

(10) Patent No.: US 12,532,415 B2
(45) Date of Patent: Jan. 20, 2026

(54) NON-UNIFORM SURFACE MOUNT PADS

(71) Applicant: DELL PRODUCTS L.P., Round Rock, TX (US)

(72) Inventors: Umesh Chandra, Santa Cruz, CA (US); Douglas Wallace, Round Rock, TX (US); Bhyrav Mutnury, Austin, TX (US)

(73) Assignee: DELL PRODUCTS L.P., Round Rock, TX (US)

( * ) Notice: Subject to any disclaimer, the term of this patent is extended or adjusted under 35 U.S.C. 154(b) by 6 days.

(21) Appl. No.: 18/419,212

(22) Filed: Jan. 22, 2024

(65) Prior Publication Data
US 2024/0164018 A1 May 16, 2024

Related U.S. Application Data

(63) Continuation of application No. 16/888,644, filed on May 29, 2020, now Pat. No. 11,882,655.

(51) Int. Cl.
*H05K 1/11* (2006.01)
*H05K 1/02* (2006.01)

(52) U.S. Cl.
CPC .......... *H05K 1/111* (2013.01); *H05K 1/0215* (2013.01); *H05K 1/025* (2013.01); *H05K 2201/09709* (2013.01); *H05K 2201/10318* (2013.01); *H05K 2201/10636* (2013.01)

(58) Field of Classification Search
CPC ...... H05K 1/111; H05K 1/0215; H05K 1/025; H05K 2201/10318; H05K 2201/10636; H05K 2201/09709; H05K 3/4015
See application file for complete search history.

(56) References Cited

U.S. PATENT DOCUMENTS

| | | | |
|---|---|---|---|
| 5,453,582 A * | 9/1995 | Amano | B23K 35/34 361/767 |
| 5,473,281 A | 12/1995 | Honjo | |
| 8,274,307 B1 | 9/2012 | Ben Artsi | |
| 9,980,378 B1 * | 5/2018 | Mutnury | H05K 1/0216 |
| 10,791,629 B1 | 9/2020 | Ren et al. | |
| 2004/0012458 A1 | 1/2004 | Amparan | |
| 2007/0268088 A1 | 11/2007 | Singh | |
| 2010/0103636 A1 | 4/2010 | Ootsuka | |
| 2010/0231320 A1 | 9/2010 | Kawamura | |
| 2015/0313005 A1 | 10/2015 | Takabatake | |
| 2018/0098415 A1 | 4/2018 | Lin | |
| 2018/0261961 A1 | 9/2018 | Luk | |
| 2018/0368259 A1 | 12/2018 | Kumar | |
| 2019/0044286 A1 * | 2/2019 | Moon | H01R 13/6471 |
| 2019/0320529 A1 | 10/2019 | Goud | |
| 2020/0328172 A1 * | 10/2020 | Lu | H05K 1/111 |
| 2021/0159625 A1 * | 5/2021 | Moon | H01R 12/737 |

* cited by examiner

*Primary Examiner* — Steven T Sawyer
(74) *Attorney, Agent, or Firm* — BAUGH LAW, LLC

(57) ABSTRACT

A high-speed transmission circuit comprises, as part of a signal path, a connector pin disposed on a pad that comprises an unused pad region. The unused pad region is not considered part of the signal path but is part of a resonant sub-circuit. In various embodiments, by properly adjusting the dimensions of the pad region and other structures in the high-speed transmission circuit, resonant frequencies of the sub-circuit are shifted to a frequency range that is outside of the frequency range of interest in the signal path, thereby, reducing insertion loss and increasing signal integrity without compromising mechanical stability.

19 Claims, 7 Drawing Sheets

NON-UNIFORM SURFACE MOUNT PADS

CROSS-REFERENCE TO RELATED APPLICATIONS

This patent application is a continuation of and claims the priority benefit of co-pending and commonly-owned U.S. Pat. No. 11,882,655, which was filed on May 29, 2020 and issued on 23 Jan. 2024, entitled "SURFACE MOUNT PADS FOR NEXT GENERATION SPEEDS," listing Umesh Chandra, Douglas Wallace, and Bhyrav Mutnury as inventors. Each reference mentioned in this patent document is incorporated by reference herein in its entirety and for all purposes.

BACKGROUND

The present disclosure relates generally to high-speed surface mount technology (SMT) connections such as SMT connectors and cables. More particularly, the present disclosure relates to improving signal integrity circuits using such SMT connections.

Many high-speed connectors take advantage of the form factor of SMT connectors, which are known to improve signal integrity when compared with other, bulkier designs. SMT cables are also becoming increasingly popular as they avoid the need for connectors altogether to avoid paddle board and connector impairments. Despite their advantages, both SMT connectors and SMT cables have a number of drawbacks. For example, depending on the direction signal traces break out from SMT components on a board, pads or lead frames of the SMT connector or cable may leave exposed an unused conductive region on the board that oftentimes causes undesired parasitic effects that greatly degrade signal quality and wipe out much of the gains archived by using SMT connections in the first place. Accordingly, it is highly desirable to find new ways to mitigate or eliminate such undesired effects without negatively impacting signal integrity.

BRIEF DESCRIPTION OF THE DRAWINGS

References will be made to embodiments of the disclosure, examples of which may be illustrated in the accompanying figures. These figures are intended to be illustrative, not limiting. Although the accompanying disclosure is generally described in the context of these embodiments, it should be understood that it is not intended to limit the scope of the disclosure to these particular embodiments.

DETAILED DESCRIPTION OF THE PREFERRED EMBODIMENTS

Figure 1:
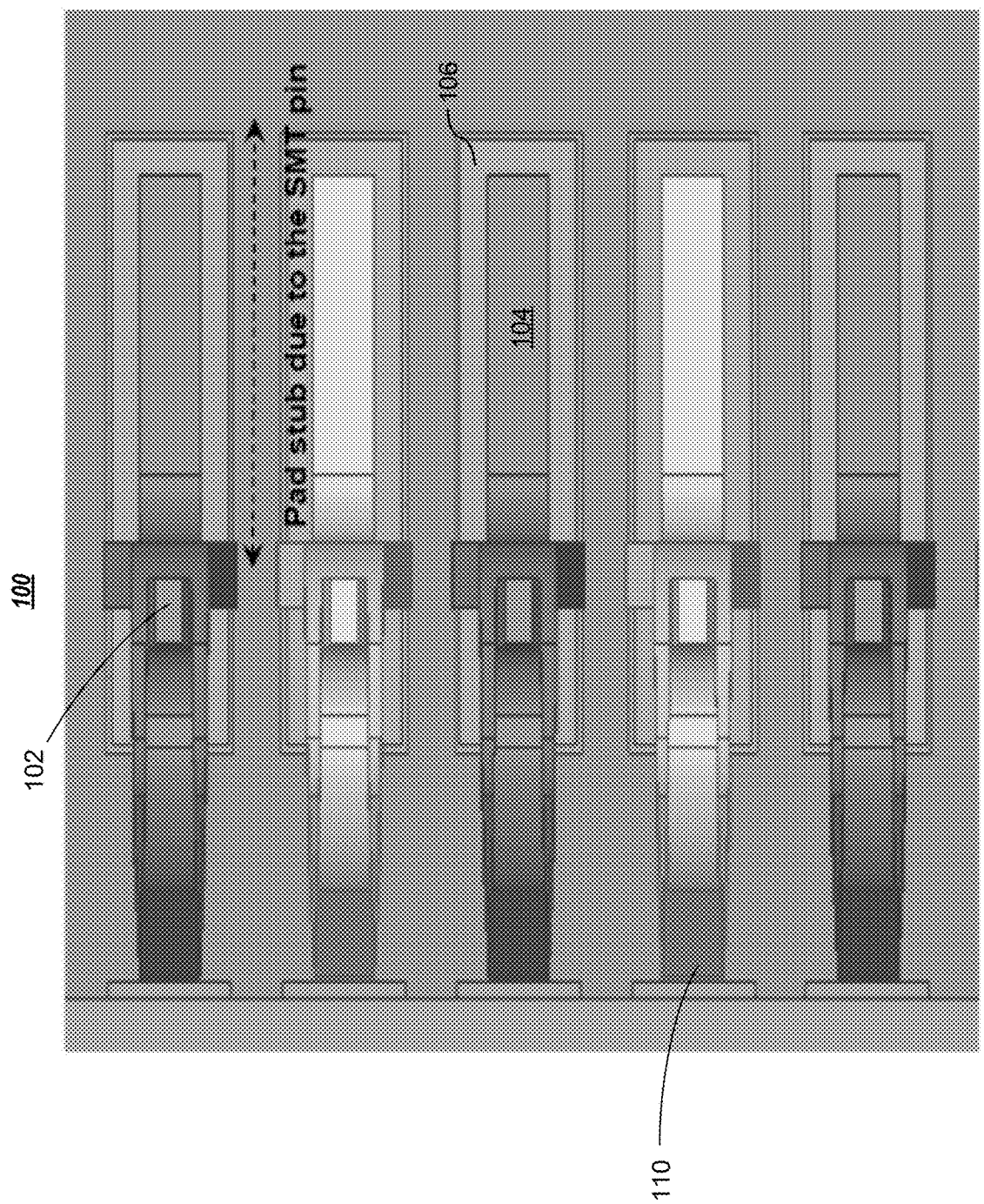
FIG. 1 is a top view of a common SMT connector circuit layout having an unused pad portion that forms a resonant stub.

In the following description, for purposes of explanation, specific details are set forth in order to provide an understanding of the disclosure. It will be apparent, however, to one skilled in the art that the disclosure can be practiced without these details. Furthermore, one skilled in the art will recognize that embodiments of the present disclosure, described below, may be implemented in a variety of ways, such as a process, an apparatus, a system/device, or a method on a tangible computer-readable medium.

Components, or modules, shown in diagrams are illustrative of exemplary embodiments of the disclosure and are meant to avoid obscuring the disclosure. It shall also be understood that throughout this discussion that components may be described as separate functional units, which may comprise sub-units, but those skilled in the art will recognize that various components, or portions thereof, may be divided into separate components or may be integrated, including integrated within a single system or component. It should be noted that functions or operations discussed herein may be implemented as components. Components may be implemented in software, hardware, or a combination thereof.

Furthermore, connections between components or systems within the figures are not intended to be limited to direct connections. Rather, data between these components may be modified, re-formatted, or otherwise changed by intermediary components. Also, additional or fewer connections may be used. It shall also be noted that the terms "coupled," "connected," "communicatively coupled," "interfacing," "interface," or any of their derivatives shall be understood to include direct connections, indirect connections through one or more intermediary devices, and wireless connections. It shall also be noted that any communication, such as a signal, response, reply, acknowledge, message, query, etc., may comprise the exchange of one or more messages.

Reference in the specification to "one embodiment," "preferred embodiment," "an embodiment," or "embodiments" means that a particular feature, structure, characteristic, or function described in connection with the embodiment is included in at least one embodiment of the disclosure and may be in more than one embodiment. Also, the appearances of the above-noted phrases in various places in the specification are not necessarily all referring to the same embodiment or embodiments.

The use of certain terms in various places in the specification is for illustration and should not be construed as limiting. The terms "include," "including," "comprise," and "comprising" shall be understood to be open terms and any lists the follow are examples and not meant to be limited to the listed items. The words "optimal," "optimize," "optimization," and the like refer to an improvement of an outcome or a process and do not require that the specified outcome or process has achieved an "optimal" or peak state.

It shall be noted that any experiments and results provided herein are provided by way of illustration and were performed under specific conditions using a specific embodiment or embodiments; accordingly, neither these experiments nor their results shall be used to limit the scope of the disclosure of the current patent document.

It shall also be noted that although embodiments herein may be described within the context of SMT connectors, aspects of the present disclosure are not so limited. As a person of skill in the art will appreciate that the teachings described herein may improve signal integrity in other circuits that exhibit similar or different transmission line effects. For example, discrete circuit components, such as capacitors and inductors soldered on a PCB trace or cables that could form a stub at certain frequencies may benefit from using the teachings described herein. Accordingly, the aspects of the present disclosure may be applied or adapted for use in many other contexts.

Ever-increasing demands on bandwidth and thus transmission speeds for digital signal processing require higher and higher operating frequencies, i.e., high-speed signals that have shorter and shorter wavelengths and signals with picosecond rise times. As is known in the art, once the geometrical dimensions of conductors and other conductive structures shrink to levels that are comparable to the electrical wavelengths of the signals transmitted by such conductors, this gives rise to transmission line effects. Oftentimes, these effects change the electrical transmission characteristics of a communication channel in a manner that result in unwanted signal distortion, increased insertion loss (single-ended or differential), and other non-linearities that adversely affect signal integrity.

For example, once the length of a via—a plated through-hole representing a branch of a tee junction in a signal path—in an integrated circuit is at or about a quarter-wavelength of the high-frequency electrical signal in the signal path, the via behaves like an open circuit transmission line, even if the via itself has not been designed to carry any high-frequency signals.

To ameliorate adverse transmission line effects of vias on signal integrity and improve insertion loss, common design considerations involve shielding of ground vias, choice of desired signal and ground via assignments, and mechanical back drilling that removes (i.e., drills out) conductive material (e.g., copper) from unused portions of the via, which may then be filled with a dielectric material, such as an electrically non-conductive epoxy. Such added, costly manufacturing steps introduce their own mechanical and electrical drawbacks, e.g., differing thermal expansion coefficients of the epoxy and the plated via, and the like.

FIG. 1 is a top view of a common SMT connector circuit layout having an unused pad portion that forms a resonant stub that may cause unwanted resonance effects. Circuit 100 circuit may be used, for example, for 28 GB/sec non-return-to-zero (NRZ) signaling and comprises a lead frame that includes connector pin 102 and pin leg 104. Circuit 100 further comprises connector pad 106, and a signal path 110 that includes connector pin 102. Circuit components 102-106 may be formed from electrically conductive material, e.g., copper that is mounted on a non-conductive PCB material, such as FR4 dielectric that is not shown in FIG. 1. Also not shown in FIG. 1 are conductive ground strips that may serve as return paths for electrical signals.

As depicted in FIG. 1, both pin leg 104 and the area of connector pad 106, which extends to the left-hand-side of connector pin 102 in FIG. 1, are not considered part of signal path 110. In other words, pin leg 104 and most of connector pad 106 in FIG. 1 are "unused" portions of SMT circuit 100.

Figure 2:
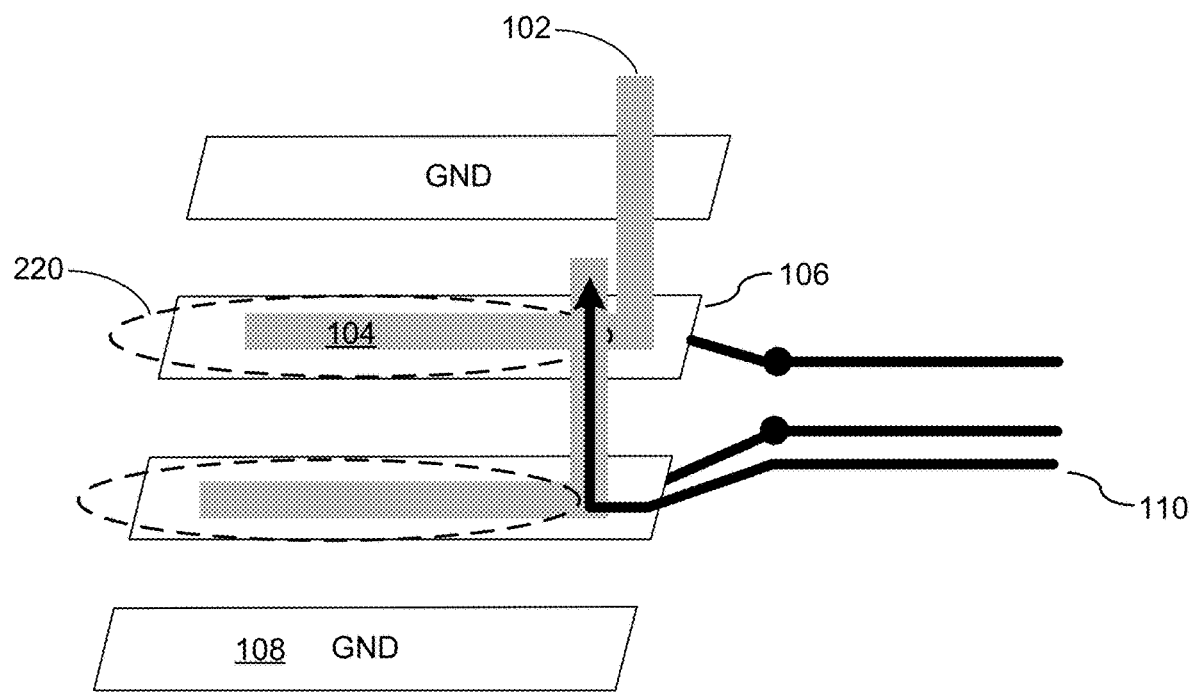
FIG. 2 is a simplified schematic illustration of the circuit in FIG. 1.

These unused portions, regions, or areas are indicated by dashed lines in FIG. 2, which is a simplified schematic illustration of the circuit in FIG. 1. Components similar to FIG. 1 are labeled in a similar manner. At high operating frequencies, e.g., in the GHz rage or in the presence of high-speed signals that, depending on data rates, have relatively short rise times in the picosecond range, these unused portions 220 of SMT circuit 200 are subject to transmission line effects (also known by their misnomer "standing wave" effects) once their electrical lengths become comparable to their physical sizes. Unused portion 220 of SMT circuit 200 generates undesired resonances, antenna effects and, under certain circumstances, behaves like an open-ended transmission line, i.e., an unterminated resonant stub acts a notch filter.

In practice, these effects (hereinafter collectively "pad resonance") depend mainly on the length of the electrically conductive stub and, more generally, on geometry, i.e., electrical inductance and capacitance are functions of geometry, which also determines the presence and locations of resonance frequencies associated with SMT circuit 200. As a rule of thumb, the greater the length or physical dimension of the unused portions is, i.e., the larger the coupling area, the greater the capacitive coupling to signal path 110 and the more adverse effects pad resonance has on crosstalk and thus on signal integrity.

Accordingly, it would be desirable to have efficient cost-effective systems and methods in place that reduce unwanted transmission line effects in SMT connections and provide excellent electrical performance for next generation speeds without compromising mechanical stability of connection of a surface mounted device (SMD) to a circuit board.

Figure 3:
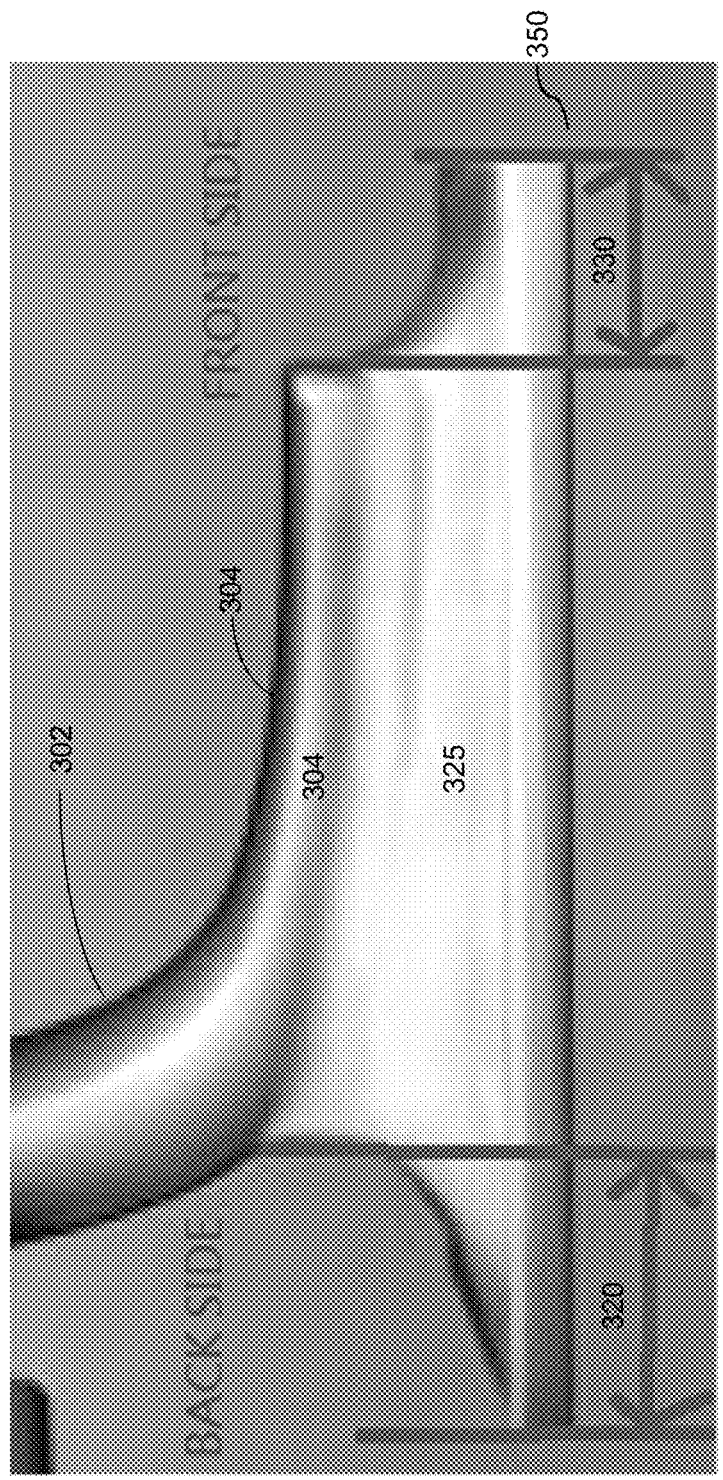
FIG. 3 shows the mating location of a lead frame that is soldered onto a pad.

FIG. 3 shows the mating location of a lead frame that is soldered onto a pad. As depicted in FIG. 3, pin 302, which is part of the lead frame, has a pin leg 304 that is bent such as to be substantially parallel to mating surface 350 and mate with metal surface 350, via wetting areas 320-330 at the front side 330, middle 325, and back side 320 of connector leg 304, respectively.

Manufacturing tolerances, variations in wetting areas 320-330, alignment variations, and other considerations, such as ensuring that pin leg 304 is properly placed on the metal surface 350 of the pad, usually require the dimension(s) of the pad on which connector pin leg 304 rests to extend beyond the dimension of pin leg 304. In addition, connector pin leg 304 is not always mounted at the same location on the PCB pad on different boards.

Figure 5A:
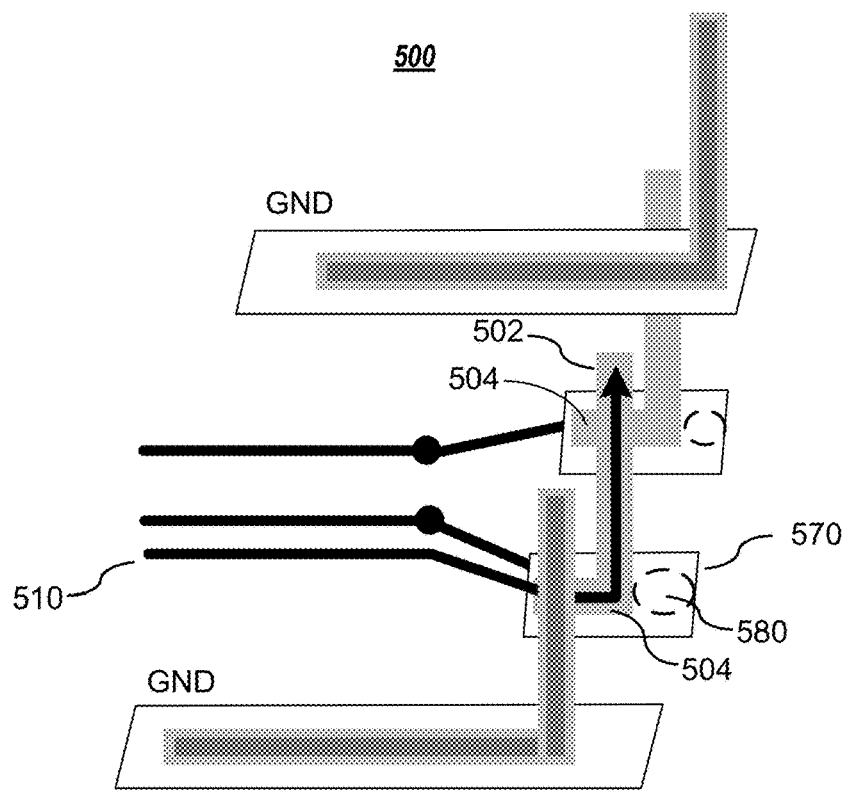
FIG. 5A depicts a PCB design having a signal breakout according to embodiments of the present disclosure.
Figure 5B:
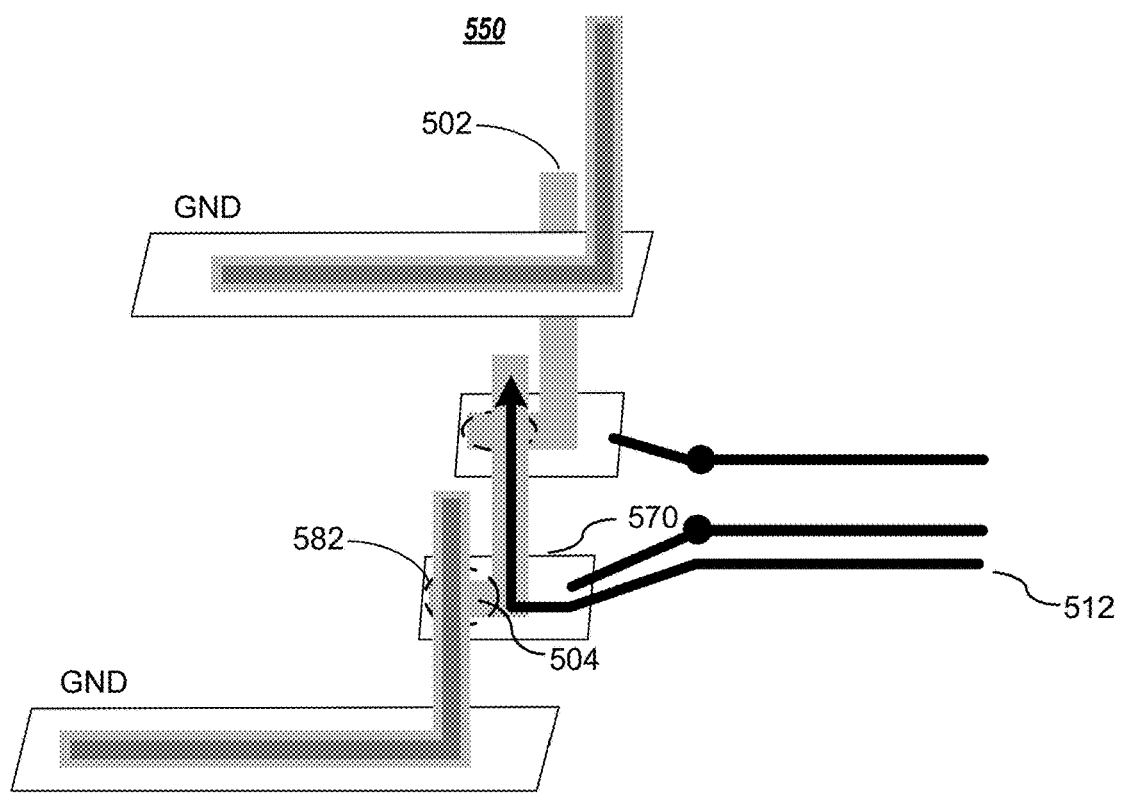
FIG. 5B depicts a PCB design having an alternate signal breakout pattern, according to embodiments of the present disclosure.

As a person of skill in the art will understand that, just like the unused portions of pad area in, e.g., FIG. 2, FIG. 5A, and FIG. 5B, the wetting areas at the front side 320 and/or back side 330 of leg 304 contribute to the pad resonance. In addition, as can be easily gleaned from FIG. 2, FIG. 5A, and FIG. 5B, the unused portions can exacerbate pad resonance and other transmission line effects when the signal breakout is sub-optimal.

Figure 4A:
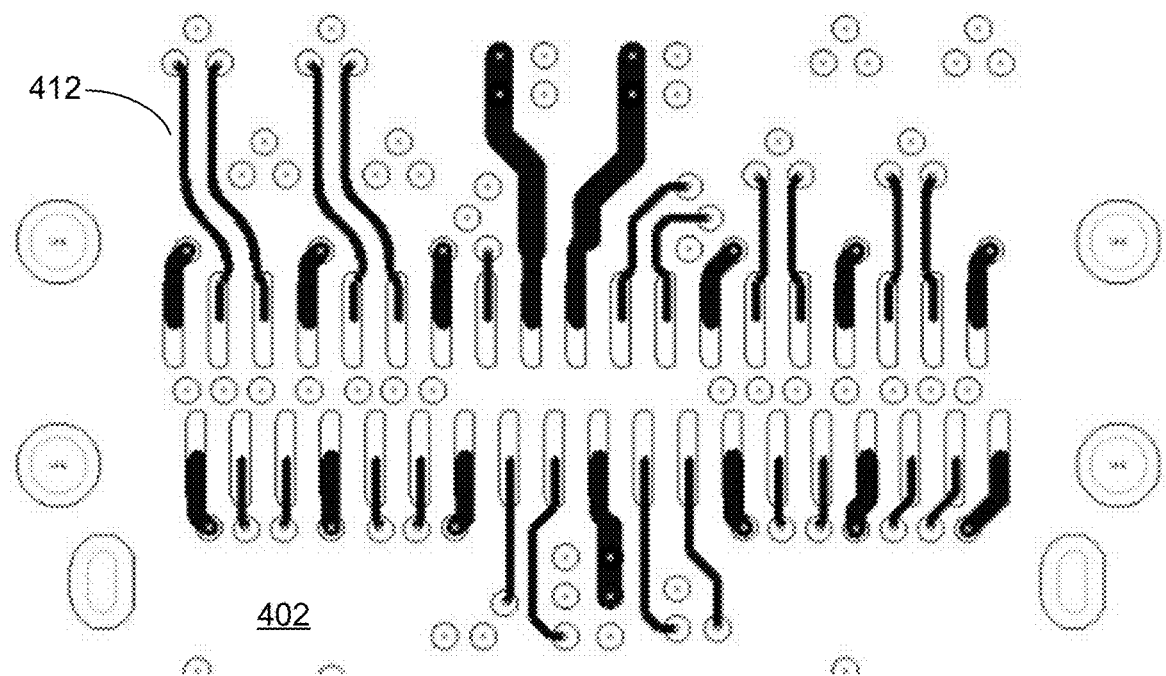
FIG. 4A depicts trace breakouts in one direction of a printed circuit board (PCB), according to embodiments of the present disclosure.
Figure 4B:
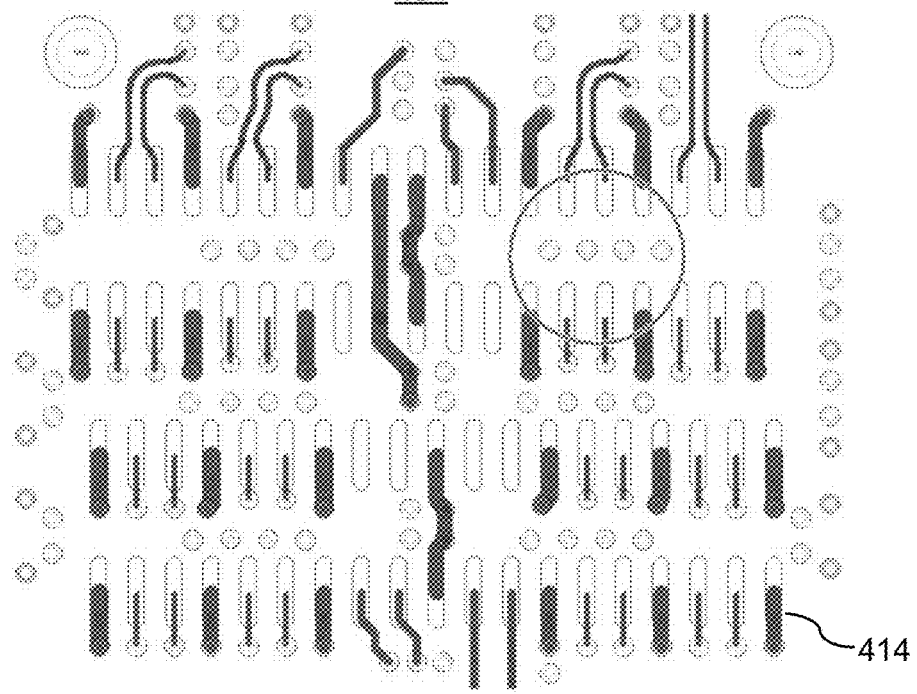
FIG. 4B depicts trace breakouts in two directions of a PCB, according to embodiments of the present disclosure.

FIG. 4A depicts traces that break out in one direction of a PCB, according to embodiments of the present disclosure. Board 402 comprises traces 412, e.g., a number of differential transmit and/or receive paths in a connector port. As shown, traces 412 are restricted to breaking out only at the top of board 402, which is typically a desired approach. In practice, however, circuit designs that use Quad Small Form-Factor Pluggable Double Density (QSFPDD), QSFP, and SFP connectors are notorious for having pad stubs where, depending on the layout engineer, the traces may breakout on any side of the pad. FIG. 4B depicts trace breakouts 414 in both directions of PCB 404, which, in embodiments, may provide routing relief. It is understood that any number of breakout options may be implemented for a given circuit, e.g., to satisfy certain footprint requirements, accommodate vendor requirements, and the like.

FIG. 5A depicts a PCB design having a signal breakout according to embodiments of the present disclosure. As shown, the signal breakout in circuit 500 leads to pin leg 504 and the area of that metal pad 570 on the left-hand-side of connector pin 502 being utilized as part of signal path 510. As previously mentioned, unused portion 580 of circuit 500 may create unwanted resonance effects that may cause, e.g., insertion loss.

In embodiments, by making pin leg 504 and most of pad 570 contribute to signal path 510, this approach advantageously reduces the dimensions of the potential resonant structure (formed by pin leg 504 and most of pad 570) to unused portion 580, i.e., the area of metal pad 570 that is located to the right-hand-side of connector pin 502.

In embodiments, unused portion 580 may be designed to be sufficiently short, e.g., in one or more physical dimensions, such as to cause one or more resonance frequencies of the resonant structure that may be created by virtue of the presence of unused portion 580 to exceed the frequency of interest of an electrical signal in signal path 510. For example, in embodiments, by shortening unused portion 580, the pad resonance frequency may be shifted toward higher frequencies relatively far away from the frequency of interest. Shifting pad resonances in this manner is not only cost-effective but it also causes unused portion 580 to less likely interfere with the electrical signal in signal path 510, thereby, improving the integrity of the electrical signal, which, advantageously, goes hand-in-hand with decreasing return loss, crosstalk, and overall end-to-end losses.

FIG. 5B depicts a PCB design having an alternate signal breakout pattern, according to embodiments of the present disclosure. As shown, the signal breakout in circuit 550 leaves exposed portions of metal pad 570 and pin leg 504 that are not intended to be part of signal path 512. In other words, these portions constitute unused portion 582. Similar to the unused portion in FIG. 5A, unused portion 582 in FIG. 5B may create unwanted resonance effects in operation that may result, e.g., in the insertion loss exceeding a desirable threshold.

Therefore, in embodiments, as with the unused portion in FIG. 5A, unused portion 582 in FIG. 5B may be designed relatively short, e.g., electrically and mechanically short, such that its pad resonance is shifted to a frequency region that is less likely to interfere with electrical signals, e.g., distort waveforms, in signal path 512, again, improving signal integrity. In embodiments, a potential loss in rigidity caused by decreasing one or more pad dimensions by shortening one or more stubs may be compensated by increasing the length of one or more ground strips to increase or maintain overall mechanical stability, as illustrated in FIG. 6A-FIG. 6C.

Figures 6A, 6B, 6C:
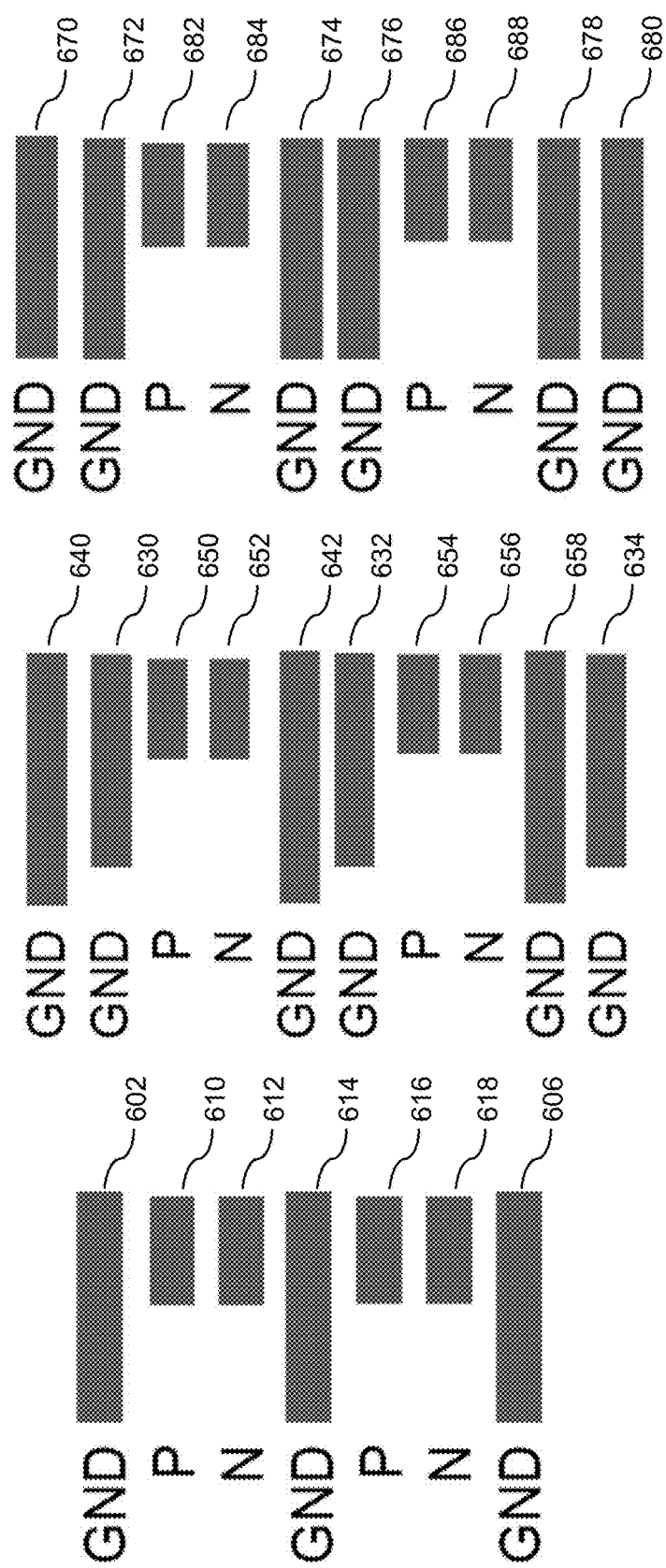
FIG. 6A-6C depict simplified schematics illustrating circuit components comprising exemplary ground strips and stubs according to embodiments of the present disclosure.

FIG. 6A-6C depict simplified schematics illustrating circuit components comprising exemplary ground strips and stubs according to embodiments of the present disclosure. FIG. 6A comprises ground strips 602-606 and stubs 610-618. As shown, one or more stubs 610-618 are designed to be electrically and mechanically shorter than one or more of ground strips 602-606, such that ground strips 602-606 and stubs 610-618 may have different length, e.g., to accommodate different connections.

In embodiments, to increase mechanical stability that may have been reduced by, e.g., shortening stubs 610-618, the length of ground strips 602-606 may be increased to enhance overall rigidity and mechanical stability. For example, ground strips 630-634 shown in FIG. 6B are designed to be longer than ground strips 640-644 to compensate for relatively short stubs 650-658.

In embodiments, as shown in FIG. 6C, a potential loss in rigidity stubs in 682-688 may be compensated by increasing the number of ground strips 670-680, again, to increase or maintain overall mechanical stability. Advantageously, the benefits of reducing or eliminating unwanted transmission line effects, including resonances, according to various embodiments of the present disclosure may be accomplished independent of the direction(s) signals break out.

In addition to varying the dimensions of ground strips 602-606 and stubs 610-618, in embodiments, the lengths of traces or other physical structures in a circuit or SMT connector that carry lower-speed signals, such as power and ground lines may be increased to ensure mechanical reliability. As a person of skill in the art will appreciate, these traces and the low-speed signals that they carry are, advantageously, much less susceptible to unwanted transmission line effects.

It is noted that items in the figures herein are not drawn to scale. It is further noted that while various circuit components may be implemented as planar microstrip designs, this is not intended as a limitation on the scope of the present disclosure. The teachings herein may equally apply to other designs, including free-standing electrical components, e.g., at lower frequencies than those discussed herein.

Figure 7:
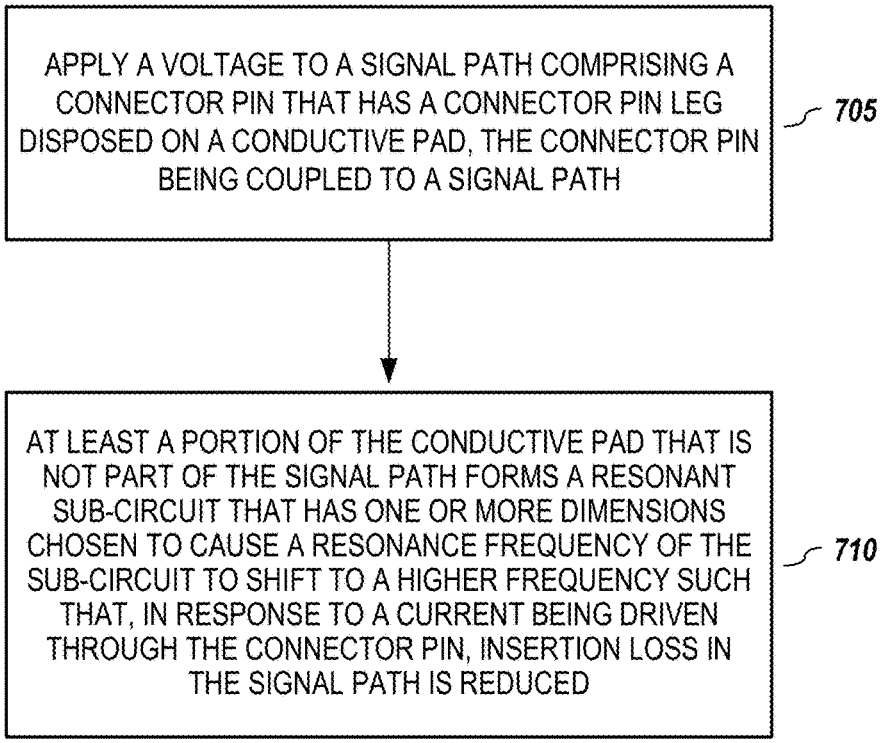
FIG. 7 is a flowchart illustrating a process for improving signal integrity, according to embodiments of the present disclosure.

FIG. 7 is a flowchart illustrating a process for improving signal integrity, according to embodiments of the present disclosure. In embodiments, process (700) for improving signal integrity may begin by applying (705) a voltage to a signal path that comprises a connector pin, such as the connector pin in one embodiment illustrated in FIG. 2. The voltage drives a current through the connector pin, which may be coupled to a connector pin leg that is disposed on a conductive pad. The connector pin leg and at least a portion of the pad that is not part of the signal path may form a resonant sub-circuit, e.g., together with a ground connection that may be capacitively coupled to at least the connector pin leg. The resonant circuit may cause transmission line effects at one or more frequencies and may cause a signal to be reflected into the signal path due to an impedance discontinuity that may result from the signal path having a different impedance than the resonant circuit.

In embodiments, the sub-circuit has one or more dimensions that are chosen in a manner that cause a resonance frequency of the sub-circuit to shift (710) to a higher frequency. As a result, once current is driven through the connector pin, insertion loss in the signal path is reduced. In embodiments, one or more physical dimensions of the sub-circuit may be chosen to be significantly smaller than the electric length of a wavelength of a signal in the signal path. Advantageously, this reduces one or more transmission line effects by removing unwanted resonance from a frequency or frequency band of interest associated with the signal in the signal path. In embodiments, one or more physical dimensions of the sub-circuit may be adjusted to more closely match an impedance of the signal path to the impedance of the resonant sub-circuit, thereby, causing less of the signal to be reflected into the signal path, further, reducing insertion loss.

It shall be noted that: (1) certain steps may optionally be performed; (2) steps may not be limited to the specific order set forth herein; (3) certain steps may be performed in different orders; and (4) certain steps may be done concurrently.

One skilled in the art will recognize that no computing system or programming language is critical to the practice of the present disclosure. One skilled in the art will also recognize that a number of the elements described above may be physically and/or functionally separated into sub-modules or may be combined together.

It will be appreciated by those skilled in the art that the preceding examples and embodiments are exemplary and not limiting to the scope of the present disclosure. It is intended that all permutations, enhancements, equivalents, combinations, and improvements thereto that are apparent to those skilled in the art upon a reading of the specification and a study of the drawings are included within the true spirit and scope of the present disclosure. It shall also be noted that elements of any claim or claims may be arranged differently including having multiple dependencies, configurations, and combinations.

What is claimed is:

1. A method comprising:
    for a surface mount technology (SMT) pad structure of a circuit board:
    configuring a first pad on the circuit board, in which the first pad has a first length and is configured to receive a first connector pin of a surface mounted device (SMD) and, when attached to the first connector pin of the SMD, aids in mechanical stability of the SMD on the circuit board; and configuring a second pad having a second length that is smaller than the first length to receive a second connector pin of the SMD, in which the second length results in a smaller stub section on both ends of the second pad when the second connector pin is attached to the second pad to reduce resonance during operation regardless of which end of the second pad a trace extends from the second pad.

2. The method of claim 1, wherein the second length is at least half the length of the first length.

3. The method of claim 1, wherein the first pad is configured for connecting to power, ground, or a low-speed signal.

4. The method of claim 1, further comprising:
    configuring a plurality of pads of a configuration like the first pad on the circuit board; and
    configuring a plurality of pads of a configuration like the second pad on the circuit board.

5. The method of claim 4, wherein:
    at least one of the pads configured like the second pad has a signal trace connected to its pad that is routed in a first direction; and
    at least one of the pads configured like the second pad has a signal trace connected to its pad that is routed in a second direction.

6. The method of claim 1, further comprising:
    connecting a first connector pin of a surface mounted device (SMD) to the first pad; and
    connecting a second connector pin of the SMD to the second pad,
    in which connection of the first connector pin of the SMD to the first pad provides greater mechanical connection than connection of the second connector pin of the SMD to the second pad.

7. The method of claim 1, wherein the second length of the second pad reduces resonance at a frequency of interest by improving impedance matching at the frequency of interest.

8. The method of claim 1, wherein the second length of the second pad is determined, at least in part, using a transmission rate of a signal anticipated to be conducted using the second pad.

9. A method comprising:
    for a first pad of a first trace of a circuit board, connecting a first connector pin for a first signal of a surface mounted device (SMD) to the first pad, in which a connector pin leg of the first connector pin connects to the first pad and, regardless of which direction the first trace extends from the first pad, a stub portion of the first pad is formed having a dimension that reduces insertion loss due to the stub portion; and
    for a second pad of a second trace of the circuit board, connecting a second connector pin of the SMD to the second pad, which comprises at least one dimension larger than the first pad to provide increased mechanical connection between the second connector pin and the second pad relative to mechanical connection between the first connector pin and the first pad.

10. The method of claim 9, wherein the at least one dimension of the first pad is a first length and is at least half the length of a length of the second pad.

11. The method of claim 10, wherein the first length of the first pad reduces resonance at a frequency of interest by improving impedance matching at a frequency of interest.

12. The method of claim 9, wherein the second pad is configured for connecting to power, ground, or a signal that has a lower frequency than the first signal.

13. The method of claim 9, further comprising: connecting a plurality of connector pins of the SMD to a plurality of pads of the circuit board that have a same or similar sizing as the first pad, in which one connector pin is connected to one pad.

14. The method of claim 9, wherein:
    at least one pad that has a same or similar sizing as the first pad has a signal trace routed toward a first end of the circuit board; and
    at least one other pad that has a same or similar sizing as the first pad has a signal trace routed toward a second end of the circuit board.

15. The method of claim 9, wherein the at least one dimension of the first pad is determined, at least in part, using an expected transmission rate of the first signal.

16. A method comprising:
    driving a signal via a first signal path involving a surface mounted device (SMD) connected to a circuit board, in which the first signal path comprises:
    a first connector pin leg of a first connector pin of the SMD that is coupled to a first pad of the circuit board to form a first connection; and a trace that extends from the first pad, in which the first pad is sized to limit signal degradation by such that, regardless of which direction the trace extends from the first pad, forms a stub formed from a portion of the first pad that is not part of the first signal path does not degrade the signal more than a threshold amount, wherein the SMD is connected to the circuit board via a second connection formed from a second connector pin leg of a second connector pin being coupled to a second pad having a second size that is larger than a size of the first pad to provide more mechanical connection via the second connection relative to the mechanical connection provided by the first connection.

17. The method of claim 16, wherein a second stub formed by the second connection creates a negligible insertion loss relative to a second signal associated with the second connection.

18. The method of claim 16, wherein the first size comprises a first length, the second size comprises a second length, and the second length is at least double the first length.

19. The method of claim 16, wherein the first signal path is routable from either side of the first pad.

* * * * *